United States Patent
Schafferer (10) Patent No.: US 10,230,387 B2
(45) Date of Patent: Mar. 12, 2019

(54) METHODS AND DEVICES FOR DIGITAL TO ANALOG CONVERSION BY PULSE COUPLING

(71) Applicant: S9ESTRE, LLC, Amesbury, MA (US)

(72) Inventor: Bernd Schafferer, Amesbury, MA (US)

(73) Assignee: S9ESTRE, LLC, Amesbury, MA (US)

( * ) Notice: Subject to any disclaimer, the term of this patent is extended or adjusted under 35 U.S.C. 154(b) by 0 days.

(21) Appl. No.: 15/751,812

(22) PCT Filed: Aug. 12, 2016

(86) PCT No.: PCT/US2016/046771
§ 371 (c)(1),
(2) Date: Feb. 9, 2018

(87) PCT Pub. No.: WO2017/027803
PCT Pub. Date: Feb. 16, 2017

(65) Prior Publication Data
US 2018/0241412 A1    Aug. 23, 2018

Related U.S. Application Data

(60) Provisional application No. 62/317,525, filed on Apr. 2, 2016, provisional application No. 62/304,478, filed on Mar. 7, 2016, provisional application No. 62/214,119, filed on Sep. 3, 2015, provisional application No. 62/204,035, filed on Aug. 12, 2015.

(51) Int. Cl.
*H03M 1/00*       (2006.01)
*H03M 1/74*       (2006.01)

(52) U.S. Cl.
CPC .......... *H03M 1/747* (2013.01); *H03M 1/002* (2013.01); *H03M 1/74* (2013.01)

(58) Field of Classification Search
None
See application file for complete search history.

(56) References Cited

U.S. PATENT DOCUMENTS

| | | |
|---|---|---|
| 3,388,989 A | 6/1968 | Sor |
| 3,523,018 A | 8/1970 | Geissler et al. |
| 3,565,599 A | 2/1971 | Sor |

(Continued)

FOREIGN PATENT DOCUMENTS

| | | |
|---|---|---|
| WO | WO 02/38521 A2 | 5/2002 |
| WO | WO 2016/028438 A1 | 2/2016 |

OTHER PUBLICATIONS

Min Park et al., An Amplitude Resolution Improvement of an RF-DAC Employing Pulsewidth Modulation, IEEE Transactions on Circuits and Systems—I: Regular Papers, vol. 58, No. 11, Nov. 2011. (Year: 2011).*

(Continued)

*Primary Examiner* — Howard Williams
(74) *Attorney, Agent, or Firm* — Patterson Thuente Pedersen, P.A.

(57) ABSTRACT

Converter circuits and methods herein describe mechanisms for converting a digital input signal to an analog output signal using a series of transmission lines. The circuits and methods described herein convert to analog signal using very little power, due to inter-coupling of wave propagation media.

16 Claims, 6 Drawing Sheets

(56) References Cited

U.S. PATENT DOCUMENTS

| | | | |
|---|---|---|---|
| 4,462,819 A | | 7/1984 | Van Der Puy et al. |
| 6,476,748 B1 | * | 11/2002 | Galton ................ H03M 1/0675 |
| | | | 341/144 |
| 6,830,603 B2 | | 12/2004 | Whitehurst et al. |
| 6,977,602 B1 | * | 12/2005 | Ostrem ............... H03M 1/0863 |
| | | | 341/141 |
| 7,088,104 B2 | | 8/2006 | Bottomley |
| 7,504,976 B1 | | 3/2009 | Pellon |
| 8,174,247 B2 | | 5/2012 | Sander |
| 8,766,607 B2 | | 7/2014 | Sander |
| 9,344,104 B1 | | 5/2016 | Schafferer |
| 9,444,401 B1 | | 9/2016 | Schafferer |
| 2010/0175444 A1 | | 7/2010 | Sanders et al. |
| 2012/0067094 A1 | | 3/2012 | Pursell et al. |
| 2013/0033118 A1 | | 2/2013 | Karalis et al. |
| 2013/0057447 A1 | | 3/2013 | Pivit et al. |
| 2013/0079060 A1 | | 3/2013 | Pivit et al. |
| 2013/0307468 A1 | | 11/2013 | Lee et al. |
| 2014/0184339 A1 | * | 7/2014 | Gomez ..................... H03F 3/19 |
| | | | 330/297 |

OTHER PUBLICATIONS

Yunliang Zhu, A 10.9 GS/s, 64 Taps Distributed Waveform Generator with DAC-Assisted Current-Steering Pulse Generators in 0.18μm Digital CMOS, IEEE 2007 Topical Meeting on Silicon Monolithic Integrated Circuits in RF Systems, Conference date Jan. 10-12, 2007, Long Beach CA.. (Year: 2007).*

International Search Report for corresponding International Application No. PCT/US2016/046771 dated Oct. 26, 2016; 2 pages.

Written Opinion of the International Searching Authority for corresponding International Application No. PCT/US2016/046771 dated Oct. 26, 2016; 5 pages.

International Search Report for related International Application No. PCT/US2016/040807 dated Oct. 6, 2016; 2 pages.

Written Opinion of the International Searching Authority for related International Application No. PCT/US2016/040807 dated Oct. 6, 2016; 7 pages.

Djukić et al., "A planar 4.5-GHz DC-DC power converter," IEEE Transactions on Microwave Theory and Techniques (Aug. 1999) vol. 47, No. 8; 1457-1460.

Related International Application No. PCT/US2016/040807.

* cited by examiner

$$u_{s,t} = decode(inp_t)$$
$$x_{s,t+1} = A_s \times x_{s,t} + B_s \times u_{s,t}$$
$$out_t = C_s \times x_{s,t} + D_s \times u_{s,t}$$

$$A_{s,t}, u_{s,t} = decode(inp_t)$$
$$x_{s,t+1} = A_{s,t} \times x_{s,t} + B_s \times u_{s,t}$$
$$out_t = C_s \times x_{s,t} + D_s \times u_{s,t}$$

METHODS AND DEVICES FOR DIGITAL TO ANALOG CONVERSION BY PULSE COUPLING

CROSS REFERENCE TO RELATED APPLICATIONS

This application is a National Phase entry of PCT Application No. PCT/US2016/046771, filed on Aug. 12, 2016, which claims the benefit of U.S. Provisional Patent Application Nos. 62/317,525, filed Apr. 2, 2016, 62/304,478, filed Mar. 7, 2016, 62/214,119 filed Sep. 3, 2015, and 62/204,035, filed Aug. 12, 2015, all of which are incorporated by reference herein.

TECHNICAL FIELD

Embodiments relate to the field of digital to analog conversion of signals, and more specifically to the generation of high power radio frequency (RF) signals based on digital input signals.

BACKGROUND

In conventional RF signal chain designs, a low power analog base-band signal is generated based on a digital base-band signal. The analog base-band signal is modulated onto a RF carrier using a mixer or modulator, generating a low power RF signal. The low power RF signal is amplified and transmitted via an antenna. To achieve the required performance parameters such as signal to noise ratio, RF frequency range, and signal bandwidth, spurious free dynamic range high performance analog mixed signal components have to be used in these conventional systems.

Current steering digital to analog converters (DACs) are a popular architecture for generating analog RF signals from digital RF signals. High impedance current sources and fast switches, readily available in modern process technologies and using Kirchoff's current law for summing currents on a node are factors for the success of current steering DAC. However, for high output power applications, the current sources and the switching device consume a substantial amount of power during operation which makes current steering DAC not suitable for high output power applications.

SUMMARY

In an embodiment, a pulse source provides pulses into a network of coupled transmission lines generating electromagnetic waves traveling on the transmission lines. An output network coupled to the network of coupled transmission lines collects energy of the electromagnetic waves to form an output signal. Coupling properties of transmission lines and reflective properties of electromagnetic wave on the transmission lines are used to shape the electromagnetic waves in the network. A controller receives a digital data stream and controls the coupling between the transmission lines and/or the termination of the transmission lines and/or the coupling to the output network to affect the energy flow from the pulse source through the network of coupled transmission lines to the output network.

The above summary is not intended to describe each illustrated embodiment or every implementation of the present invention. The detailed description and claims that follow more particularly exemplify these embodiments.

BRIEF DESCRIPTION OF THE DRAWINGS

Subject matter hereof may be more completely understood in consideration of the following detailed description of various embodiments in connection with the accompanying figures, in which:

FIG. 1$a$ is a block diagram of a conventional digital to analog converter (DAC).

FIG. 1$b$ is a timing diagram of a conventional DAC.

FIG. 1$c$ is a matrix representation of a conventional digital to analog conversion process.

FIG. 1$d$ is a schematic diagram of multiple pulse DAC in a conventional digital pre-distortion loop.

FIG. 2$a$ is a block diagram of a pulse coupling DAC, according to an embodiment.

FIG. 2$b$ is a timing diagram of the pulse coupling DAC of FIG. 2$a$.

FIG. 2$c$ is a block diagram of a complementary pulse coupling DAC, according to an embodiment.

FIG. 3$a$ is a block diagram of a pulse coupling DAC, according to an embodiment.

FIG. 3$b$ is a block diagram of a pulse coupling DAC, according to an embodiment.

FIG. 4$a$ is a block diagram of a pulse coupling DAC, according to an embodiment.

FIG. 4$b$ is a physical implementation of a pulse coupling DAC, according to an embodiment.

FIG. 5$a$ is a block diagram of a pulse coupling DAC, according to an embodiment.

FIG. 5$b$ is a physical implementation of the pulse coupling DAC of FIG. 5$a$.

FIG. 6$a$ is a block diagram of a pulse coupling DAC, according to an embodiment.

FIG. 6$b$ is a block diagram of a pulse coupling DAC, according to an embodiment.

FIG. 6$c$ is a block diagram of a pulse coupling DAC, according to an embodiment.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The power consumption of current steering DACs is determined by the output voltage and output current of the DAC, combined with the power required to drive the switches, bias circuits, clocking circuits and digital decoder circuits. The output current and voltage affects the power consumption of the switches and the current sources. When optimizing a current steering DAC for output power, the power over the switches and current sources will become the dominant factor. The thermal resistance of the package and the maximum chip temperature limit the maximum output power of the DAC. In many conventional systems, the output power of a state of the art RF DAC can be in the milliwatt range. However, for software defined radio (SDR) and multiple input multiple output (MIMO) applications, higher output power levels in the 0.1-10 Watt range are desirable. The disclosed embodiments address this problem, by 1) using electromagnetic pulses instead of switched currents and 2) using the coupling properties of coupled wave propagation media to form an output signal. In some embodiments the use of pulses allows for zero voltage switching (ZVS) architectures. ZVS architectures further minimize the power consumption and reduce the stress on the switching devices.

Throughout the drawings, dashed lines indicate that there are multiple instances between the solid lines that the dashed lines extend between. In the timing diagrams these dashed lines can depict alternate states of signals. In the circuit diagrams the dashed lines depict addition/optional connections Another aspect of the presented DAC, in contrast to conventional current steering DACs, is the sequence of generating the output signal. In a current steering DAC, the output current pulse is generated by switching constant currents onto or from the output terminal. The switches, controlling these currents, determine the timing accuracy of the current pulses. With the presented DAC, in contrast, a pulse is generated by a pulse source or oscillator. The pulse is then routed through a coupling network. The coupling network parameters determine how much of the pulse energy is coupled to the output. The setting of the network parameters will not affect the timing accuracy of the pulse, as would the switches of a conventional current steering DAC. This decoupled process of the generation of pulse and the steering of pulse obviates the problem of timing errors introduced in the current switching process of conventional current steering digital to analog converter.

Figure 1A:
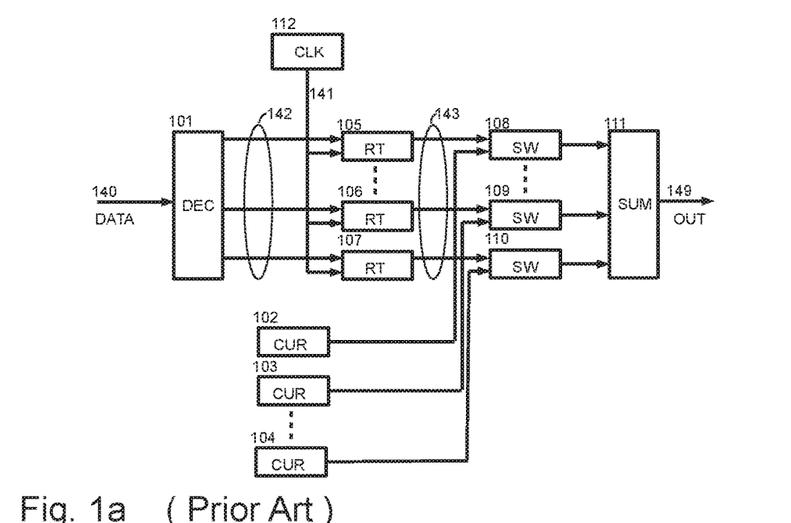

FIG. 1a depicts a block diagram of a conventional high speed current steering DAC. For simplicity, a single ended implementation is depicted in FIG. 1a, although in some conventional systems other implementations are possible. A digital data signal 140 is decoded by decoder 101 into control signals 142. In high speed designs the decoded signals 142 are re-timed by re-timing blocks 105 to 107. This step is necessary to avoid the signal delay variations through the decoder 101. The re-timing is achieved by aligning all control signals 142 to a common time reference signal 141 provided by a clock source 112. After this step the re-timed control signals 143 have the necessary timing accuracy to drive analog domain signals. Based on the status of the re-timed control signal 143 the switches 108 to 110 switch the current provided by current sources 102 to 104 to the output 149. A summing network 111 collects all the currents from the switches and routes the currents to the output 149.

In case of the current steering DAC the summing network is governed by Kirchoff's current law. The number of data lines in bus 143 and their associated weight is called the segmentation. Each segment consists of one data line in bus 143, the associated switch from the switch array 108 to 110 and the associated current source from the current array 102 to 104. A common segmentation scheme in digital to analog converter is a mixture of thermometer decoded and binary decoded segments. The weights of the thermometer decoded segments are all the same (1 in this example). The weights of the binary decoded segments are ½, ¼, ⅛ . . . 1/n of a thermometer decoded segment, where n represents the number of the least significant Bit (LSB) of data signal 140.

How many DAC bits are thermometer decoded and how many are binary decoded depends on a performance and circuit complexity trade-off. In general the more bits are thermometer decoded the better the dynamic performance of the DAC. The circuit complexity, that is number of segments, of the thermometer decoded DAC is 2^MSBS. Where MSBS is the number of thermometer decoded bits. On the other extreme an all binary decoded DAC would have only M segments, where M is the number of bits of the DAC. Segmentation mismatch errors will negatively affect the performance of the DAC and therefore set a limit to the amount of binary segments.

Figure 1B:
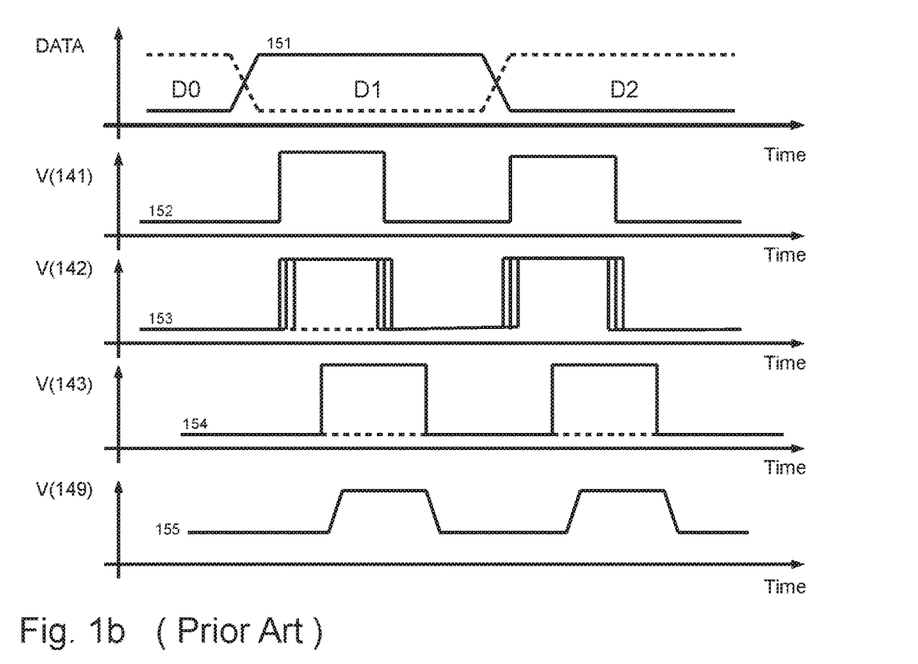

FIG. 1b depicts the timing diagram for the circuitry of FIG. 1a. Waveform 151 represents the multi-bit input data signal 140. Waveform 153 depicts the decoded control signals 142 which have timing variations based on the path they took through the decoder 101 (shown as multiple edges on waveform 153). Waveform 152 is the common time reference signal to which all decoded control signals 153 will be aligned to, produced by clock source 112.

Waveform 154 is the set of the re-timed control signals 143 based on waveform 152 from clock source 112 provided to re-timing blocks 105-107. All the rising edges occur substantially at the same time and falling edges occur substantially at the same time in waveform 154.

Waveform 155 is the resulting output signal at node 149 of the DAC, which is aligned to the common timing reference of waveform 152 and therefore will not suffer from distortions caused by the delay variations of control signals 153. FIG. 1b depicts a return to zero (RZ) DAC implementation. A non-return to zero (NRZ) DAC can be implemented using two interleaved RZ DACs.

Figure 1C:
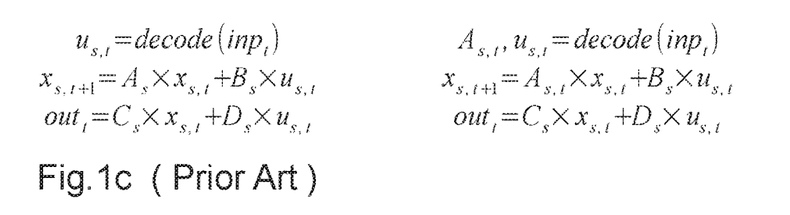

FIG. 1c depicts a mathematical representation of a DAC. In the equations presented throughout this disclosure, 't' is used to represent discrete times steps [0, 1, 2 . . . ]. The index 's' represents the segment of the DAC. The DAC has internal states described by the vector x(s,t). The input to the DAC system is the vector 'u'. The vector 'u' comes from the decoder, or controller, of the DAC and is a representation of the input data stream 140. The output of the DAC is a combination of the input 'u' to the DAC and the internal states 'x' of the DAC. The contributions are weighted by vectors or matrices C and D. Alternatively, in order to get better controllability of the system, the decoder can compute part or all of the matrix A(s,t) as indicated in the second set of equations in FIG. 1c where the matrix A is also a function of the discrete time step 't'.

Digital pre-distortion can be used to calculate the vector u(s,t) and A(s,t) to minimize the difference between the digital input signals inp(t) and the expected analog output signal out(t). Mathematical models like the models in FIG. 1c combined with methods provided by the field of control theory can be used to construct a decoder and/or a digital pre-distortion device to achieve a desired relation between digital input signal 'inp' and the expected analog output signal 'out' for the circuits described below.

Figure 1D:
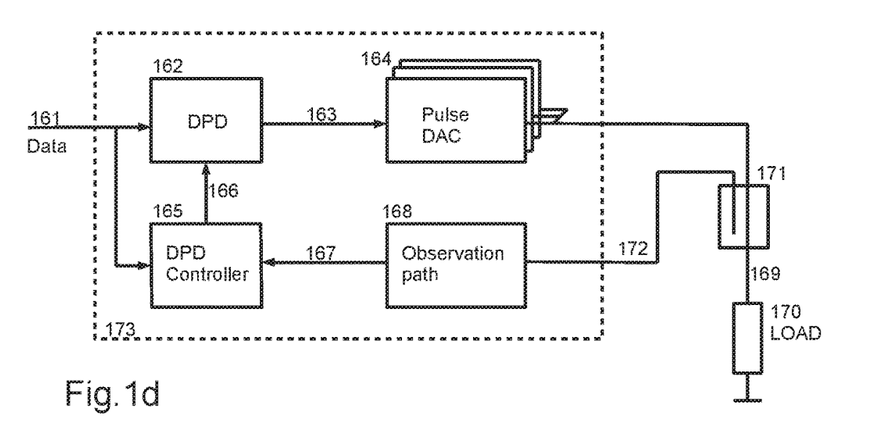

FIG. 1d depicts an embodiment of a pulse digital to analog converter in a digital pre-distortion loop. The loop is used to correct for internal state and nonlinearity errors of the pulse analog to digital converter. A digital pre-distortion block (DPD) 162 receives a digital input signal 161. The input signal 161 is a digital RF signal. The DPD 162 will correct the digital RF input signal 161 such that once it is converted into the analog domain by one or more DAC 164 the analog output signal 169 is substantially free of distortions. Distortions are an undesired byproduct of the digital to analog conversion process and result from, amongst other things, nonlinearities and inter-state interference. The DPD block 162 receives the information of how to pre-distort the digital input signal 161 from a DPD controller 165. The DPD controller compares the digital input signal with a digital representation of the analog output signal 169. Signal 167 is derived from the analog output signal 169 using a coupling element 171 and observation path 168. The coupling element 171 monitors the voltage of signal 169 or the power flowing to the load 170 and generates the analog signal 172 accordingly. Observation path 168 converts the analog output signal 169 back into a digital signal 167.

The DPD loop of FIG. 1d can be used to linearize one or multiple pulse digital to analog converter. In many cases, interleaving techniques will be used to generate a more continuous output signal to load 170. A learning algorithm can be used to find the best set of segments in the DAC to activate in order to produce a desired output. For this, in most cases, the history of internal states of the DAC has to be taken into account. To improve the likelihood for the algorithm to converge, overlapping and or redundant segments can be added to the pool of segments of the DAC.

Figure 2A:
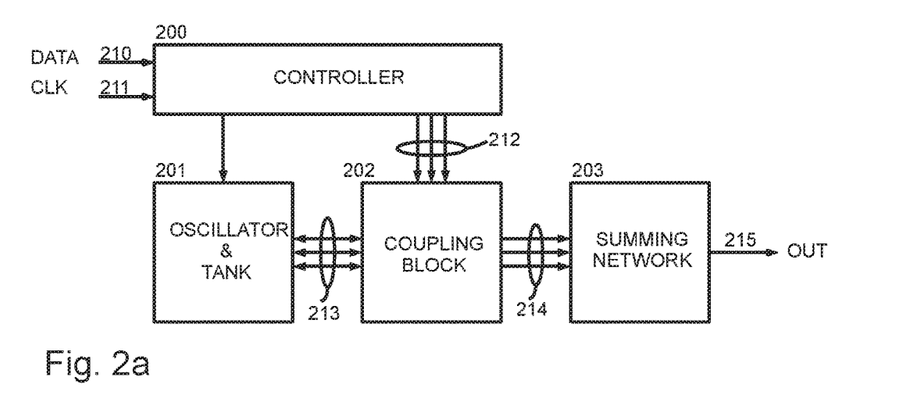

FIG. 2a depicts a block diagram of an embodiment of a pulse coupling DAC. In this embodiment the DAC is continuously producing pulses which will be converted into analog output signals. A controller 200 receives a clock signal 211 and a data signal 210. The digital data signal 210 contains the information to be converted from the digital to analog domain. The clock signal 211 determines the sampling time instances of the analog to digital converter. The controller uses the clock signals 211 to generate an oscillating signal in the oscillator & tank 201.

The oscillator & tank 201 produces a plurality of pulse signals 213. The plurality of pulse signals 213 are coupled onto to a coupling network at coupling block 202. The energy of each individual pulse signal 213 can be a fraction of the energy in the oscillator and tank during operation. The controller 200 decodes the data input signal 210 to generate control signals 212. The decoding process can be similar to a conventional digital to analog converter described previously with respect to FIGS. 1a and 1b, involving a set of thermometer decoded most significant bits and binary decoded least significant bits. Therefore the number of lines in signals 213, 214, 212 will be more than the 3 lines indicated in FIG. 2a. The control signal 212 controls the switches in the coupling block 202. In the coupling block the control signals 212 are associated with their corresponding pulse signals 213. The switches in the coupling block are capable of either reflecting individual pulse signals 213 back to the oscillator 201 or coupling the pulse to the output signals 214. The output signals 214 are combined in a summing network 203 to form the output signal 215.

The summing network 203 can be a power combiner.

The summing network in FIG. 2a can be omitted in case the coupling block 202 has only one output. In this case, the summing is performed by the coupling mechanisms of the coupling block to a single output terminal. Similarly, the oscillator tank circuit 201 can have only one output. In this case, the coupling block will distribute the signal from the oscillator 201 internally and collect the pulses for the output signal. In alternative embodiments having multiple outputs, summing network 203 and/or oscillator and tank 201 can have other configurations, as described in more detail below.

Figure 2B:
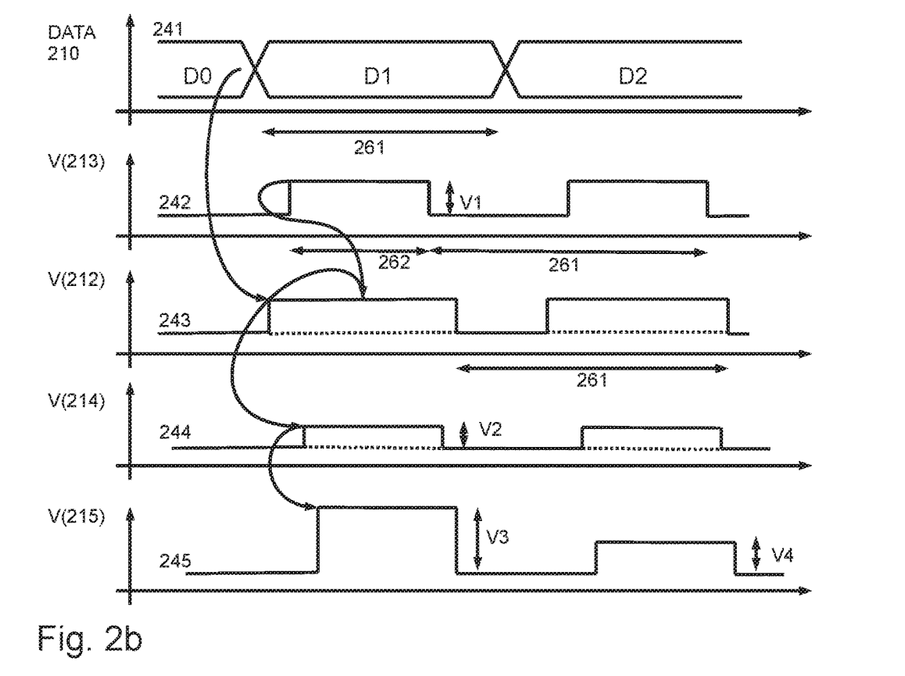

FIG. 2b is a timing diagram according the block diagram of FIG. 2a. The data input waveforms 241 arrive with a period 261. The pulse waveforms 242 have the same period as the data waveforms 241 and are derived from the oscillators signal which, in turn, is derived from the clock signal 211. The decoded waveforms 243 are shaped such that they overlap with the pulse of waveform 242 on the rising and the falling edge. The change of the states of waveforms 243 occurs when waveforms 242 are low. Depending on the state of decoded waveforms 243 the pulses of waveforms 242 will be either reflected back in the oscillator or passed on to form output waveforms 244. The individual output waveforms 244 are combined to form output waveform 245. FIG. 2b depicts a single ended and return to zero implementation. However, the DAC can be implemented in other embodiments in a differential fashion by either routing the pulses to a negatively or a positively biased output. To implement a non-return to zero (NRZ) embodiment, two return to zero (RZ) implementations can be operated in an interleaved fashion. In this example the voltage level V1 of the signals 213, waveforms 242, can be all the same. The voltage level V2 of the signals 214, waveforms 244, are either zero or at a voltage level v2. The voltages levels V3 and V4 are the combinations of the voltage levels v2 at at different time points. In general, the voltage levels v2 are smaller than the voltages levels of v1 since they are derived via electromagnetic coupling. Also, the low level of waveforms 244 don't have to be zero. A voltage level other than the high level is sufficient to build and operate the DAC.

Figure 2C:
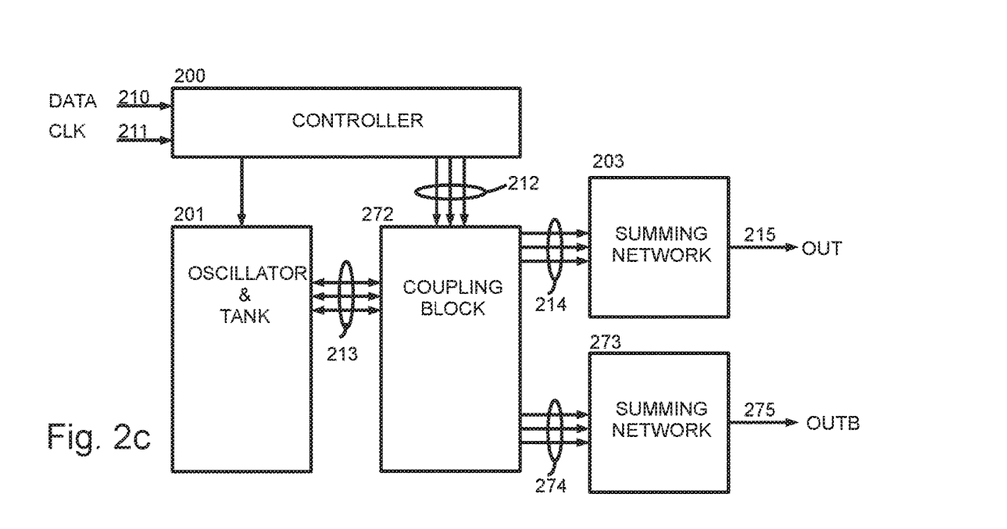

FIG. 2c depicts a complementary, or differential, version of the pulse coupling DAC of FIG. 2a. The complementary version generates two output signals 215 and 275. The function of the oscillator tanks is the same as in FIG. 2a. However, the coupling network in coupling block 272 will based to the control signals 212 couple the pulse signals 213 either to the pulse signal set 214 or to the pulse signals set 274. Pulse signals 214 will be combined in summing network 203 to form output signal 215 and pulse signals 274 will be combined in summing network 273 to form output signal 275.

Figure 3A:
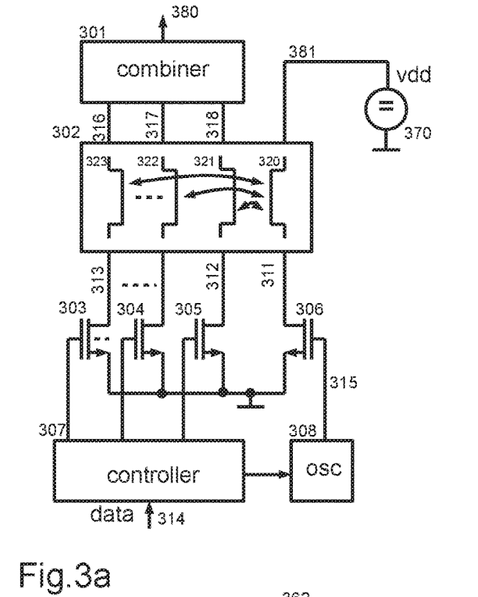

FIG. 3a depicts an embodiment of a pulse coupling DAC. A standing wave is created between node 311 and node 381. Node 381 is a low impedance node and connected to a supply voltage 370. The swing of the waveform on node 311 will be substantially twice the DC voltage on node 321 once a standing wave has established over the transmission line 320 connected between node 311 and node 321 due to the reflections of that wave occurring at the end of transmission line 320.

The frequency of the standing wave is determined by the length of the transmission line 320 and the frequency of the oscillator 308. In order to avoid unnecessary current consumption the period of the oscillator can be four times the delay of the transmission line 320. The transmission lines 323 to 321 in the set of transmission lines 302 are arrange such that they have coupling to the transmission line 320. The coupling between the transmission lines 321 to 323 to transmission line 320 can be substantially the same for all transmission lines 321-323 or different for some transmission lines in alternative embodiments. The coupling properties can be used to establish a segmentation scheme. Switches 303 to 305 are connected to one end of the transmission lines 321 to 323. In FIG. 3a the switches are shown as NMOS transistors. When a switch is open, little energy of an electromagnetic wave in transmission line 320 will be induced in the associated transmission lines 321 to 323. When the switch is closed an electromagnetic wave is induced into the associated transmission line electrically coupled to that switch (e.g., switch 303 and transmission line 323). The induced wave will travel to the other end of the transmission line. The waves from the transmission lines can be collected in a power combiner 301 to form the output signal 320. A weight can be assigned to each switch—transmission line pair by adjusting the coupling coefficient of the associated transmission lines to the main transmission line 320. The weight determines how much each switch—transmission line pair contributes to the output signal 380.

Figure 3B:
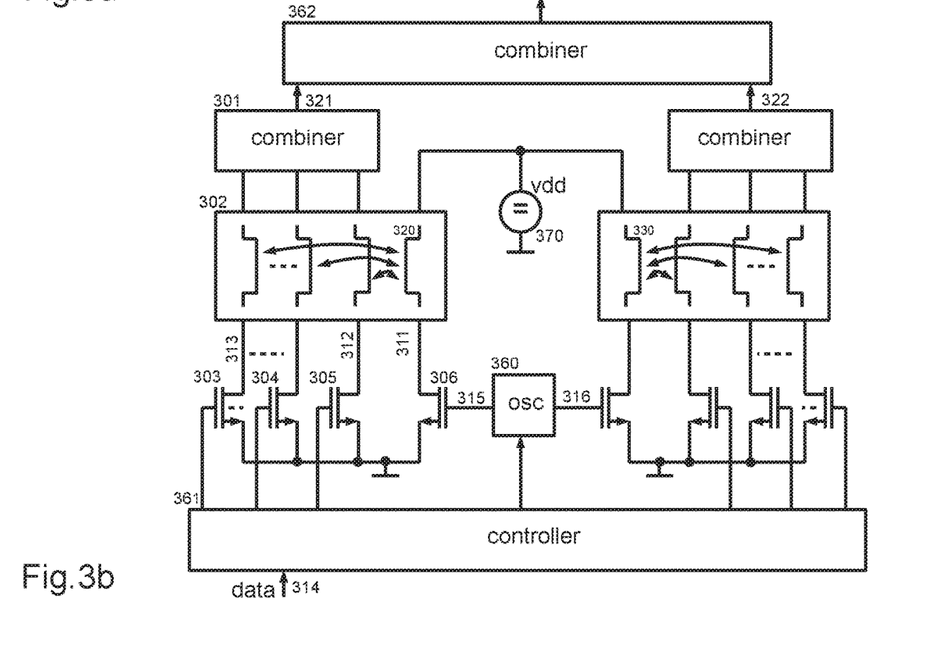

A controller can be designed to activate the switches 303, 304 to 305 such that the output signal 380 is in relation to digital input data 314. FIG. 3b is an embodiment of a pulse coupling DAC wherein both phases of the oscillation are used to generate an output signal. This is, two pulse coupling DACs operating in RZ mode are combined to make one NRZ DAC. The oscillator 360 produces complementary phased clock signals 315 and 316. The clock signals 315 and 316 have two different time bases, in this case, if one pulse starts the other pulse ends and the pulses are non overlapping. The controller 361 can send the even data samples to the DAC operating on clock signal 315 and the odd samples to the DAC operating on clock signal 316. One DAC will produce a sample during the down time of the other DAC. The output signals of the even and odd DAC 321 and 322 are combined in combiner 362 to form the output signal 380. The oscillator can have a feedback system wherein the oscillator frequency is tuned to the frequency of the tank circuit formed by transmission lines 320 and 330. The pulse DAC of FIG. 3b uses two phases, however, two or more clock pulse phases can be used to make a pulse DAC.

Figure 4A:
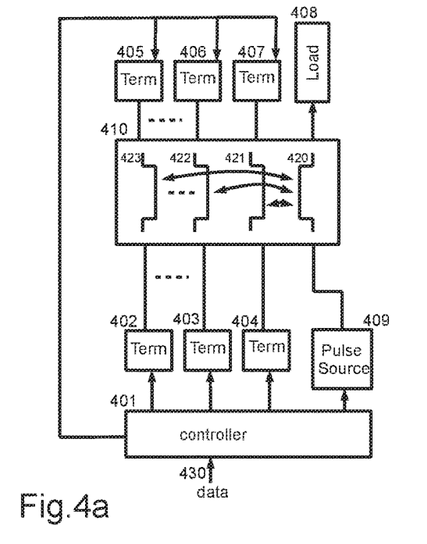

FIG. 4a depicts an embodiment of pulse coupling DAC. A pulse source 409 couples energy on to transmission line 420. The amount of energy coupled into the coupled set of transmission lines 410 depends on the termination elements 402,403 to 404. If the termination elements are low impedance more energy will be coupled onto 410 as when the termination elements are high impedance. The termination elements can be a controllable impedance elements or switches. The termination elements can be controlled by controller 401 according to the digital data input 430. The amount of energy taken out of the set of transmission lines 410 and delivered to the load is dependent on the termination elements 405, 406 to 407.

The termination elements 405, 406, and 407 (or, in alternative embodiments, any other number of termination elements) can have a fixed termination impedance or can also be controlled by controller 401. The controller controls how much of the pulse energy provided by the pulse source 409 enters the set of transmission lines 410 and how much energy exits the set. Termination elements 405 to 407 also control the effective impedance seen from the load 408 into the set of transmission lines 410. This effective impedance determines the energy transfer between transmission lines 420 to 423 and the load 408 and can be taken into account by the controller when calculating the states of the termination elements based on the input data. Similarly, the termination elements 405 to 407 can be used to control the leakage of energy from the energy coming out of the transmission lines 421 to 423 back into transmission lines 421 to 423. Depending on the implementation of the termination elements, the energy arriving at the termination elements can be either totally or partially absorbed or reflected. If there is energy reflected back into the set of transmission lines the controller must keep track of the energy states in the system and take them into account when computing the new state of the termination elements to generate the desired output signal at load 408. The equation depicted in FIG. 1c can be used to model the states and the output of the set of transmission lines 410.

Figure 4B:
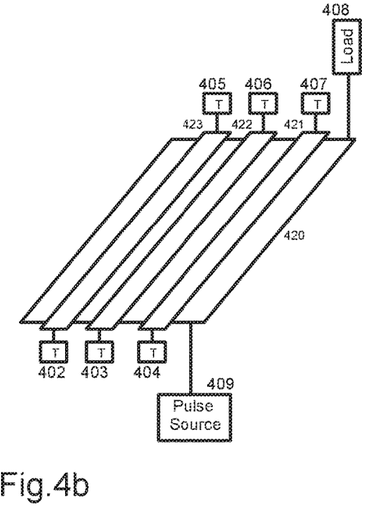

The effectiveness of the power control to the load 408 is a function of transmission line 420's isolation to a ground, where the ground node is common to all transmission lines in the set of transmission lines 410 and the routing of the ground which is common to the termination elements 402 to 404 and the pulse source 409. FIG. 4b shows an embodiment of the coupled transmission line system. In this embodiment the system is realized with a 2 layer printed circuit board (PCB). The transmission lines 421 to 423 are implemented on the top layer while the transmission line 420 is implemented on the bottom layer. The pulse source 409 and termination elements 401, 403, 404 and the controller can be implemented on a chip, in one embodiment. The termination elements 405 to 407 can have fixed values in order to avoid routing of the control signals to the termination elements 405 to 407 on the other side of the transmission lines 421 to 423. Alternatively, the transmission lines can be routed in a loop coming back to the first end of the transmission lines. The transmission lines can also be implemented using multi-layer PCB. The coupling coefficient of the transmission lines can be segmented like in a conventional DAC such that with a limited number of termination elements a wide range of possible output states can be reached. The geometry and distance of the transmission lines to each other determines the coupling coefficient between the transmission lines.

Figure 5A:
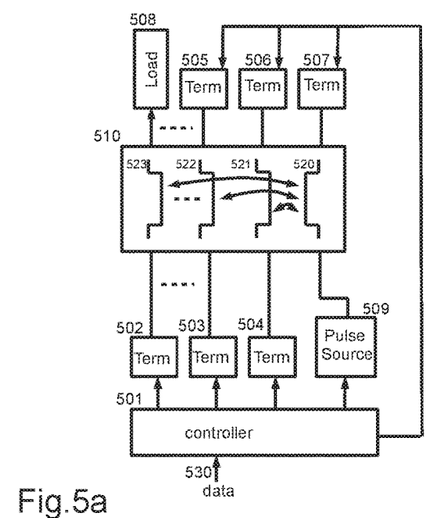

FIG. 5a depicts another embodiment of a pulse coupling DAC. In this embodiment the coupling between pulse source 509 and load 508 is established via transmission lines 520 and 523. The position of load 508 and termination element 502 can be swapped in an alternative embodiment, as the same standing wave traveling along transmission line 523 will arrive at either end thereof.

The embodiment shown in FIG. 5a also provides a galvanic isolation between the load 508 and the pulse source 509, controller 501, termination elements 503 to 507 and transmission lines 521 to 522. When a pulse is coupled onto transmission line 520 an electromagnetic wave travels toward the termination element 507. While traveling, the electromagnetic wave will couple onto transmission line 523 and some of the energy of the electromagnetic wave in transmission line 520 will be delivered to the load 508. The amount of energy transferred between transmission lines 520 and 523 depends on the status of termination elements 505 to 506 and 503 to 504 and the coupling coefficient between the transmission lines 520 to 523. The termination elements can be set to a specific impedance such that part of the energy coupled onto transmission lines 521 to 522 is absorbed in the respective termination elements 503 to 506, or, the termination element 503 to 506 can be set such that the energy on transmission lines 521 to 522 is reflected back to contribute to the next pulse samples of the DAC. The electromagnetic wave on the termination elements 503 to 506 can be reflected back into the transmission lines with the same polarity or opposite polarity depending whether the termination element is low or high impedance. In the case where the reflection coefficient is either +1 or −1, the termination elements can be implemented as switches. The controller 501 will control the termination elements 502 to 507 such that the output signal on load 508 is in relation to the digital input data signal 530.

Figure 5B:
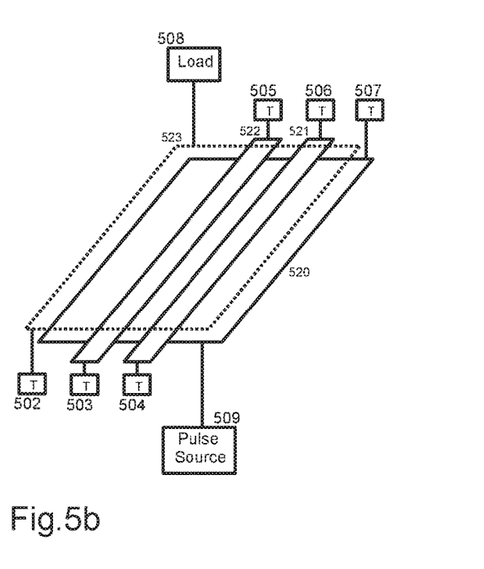

FIG. 5b depicts one possible physical implementation of the pulse couple DAC according to FIG. 5a. This design is based on a 3 layer PCB construction. The pulse source 509 is connected to a transmission line 520 constructed on the first layer of the stack. On the third layer is the load transmission line 523. The width, spacing, the dielectric layers in-between the conductive layers of the stack determine the characteristic impedance and the coupling characteristic between the transmission lines 520 to 523. Width, spacing, the dielectric layer in-between the conductive layer are free parameters and can be used to control the segmentation of the DAC. The length of the transmission lines is dependent on the pulse width of the pulse source 509 and how the reflections will be incorporated in the controller 501.

Figure 6A:
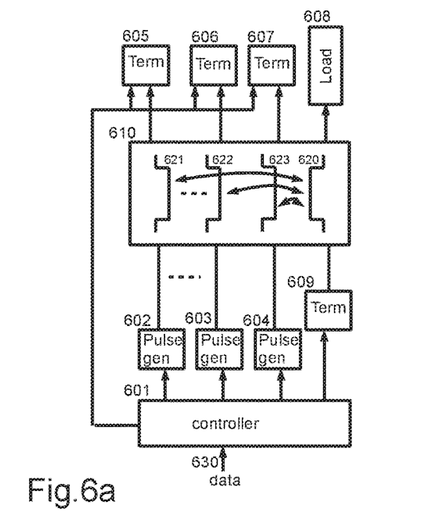

FIG. 6a depicts an embodiment of a pulse coupling DAC. The controller 620 receives the input data and triggers the pulse generators 602 to 604 accordingly. When triggered, the pulse generators 602 to 604 will send pulses over the associated transmission lines 621 to 623. The pulses traveling on the transmission lines 621 to 623 will couple onto transmission line 620. The coupling of the pulse causes a pulse on transmission line 620 which is traveling towards the load 608. The coupling coefficients between transmission lines and the value of the termination element determine the amount of energy transferred from the pulse generators 602 to 604 to the load 608. The pulses on the transmission lines 621 to 623 can be terminated in termination elements 605 to 607 or reflected back towards the pulse generators 602 to 604. When terminated the energy of the pulse can be converted into thermal energy or recovered as electric energy and reused.

Figure 6B:
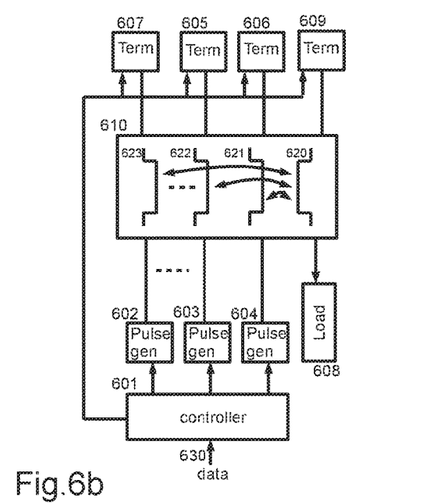
Figure 6C:
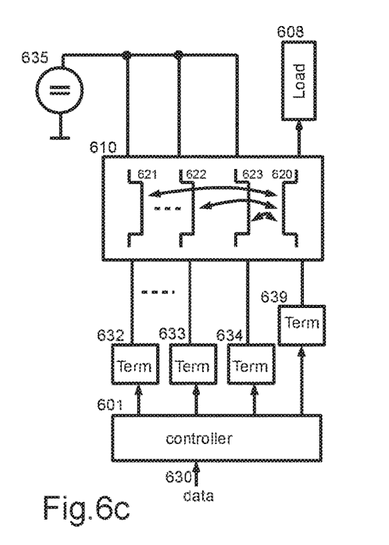

FIG. 6b is an embodiment of a pulse coupling DAC. Similar to the circuit in FIG. 6a pulse generators 602 to 604 are used to generate pulse and the pulses are coupled to the load 608 via a set of coupled transmission lines 610. However, in FIG. 6b the load is on the same side of the transmission lines 620 to 623 as the pulse generators 602 to 604. FIG. 6c is an embodiment of a pulse coupling DAC. The transmission lines 621 to 623 are charged by the DC voltage source 635. The termination elements 632 to 634 can discharge the transmission lines 621 to 623 to ground and cause an electromagnetic wave traveling from the termination elements 632 to 634 towards the DC voltage source 635. The electromagnetic waves will couple onto transmission line 620 and induce an electromagnetic wave in transmission line 620 which will travel towards the load 608. The magnitude of the electromagnetic wave traveling towards the load is determined by the number of activated termination elements 632 to 634, the termination element 639 and the coupling coefficients between the transmission lines in the set of transmission lines 610. The controller 601 will activate the number of termination elements 632 to 634 according the digital input signal 630.

Figure 7:
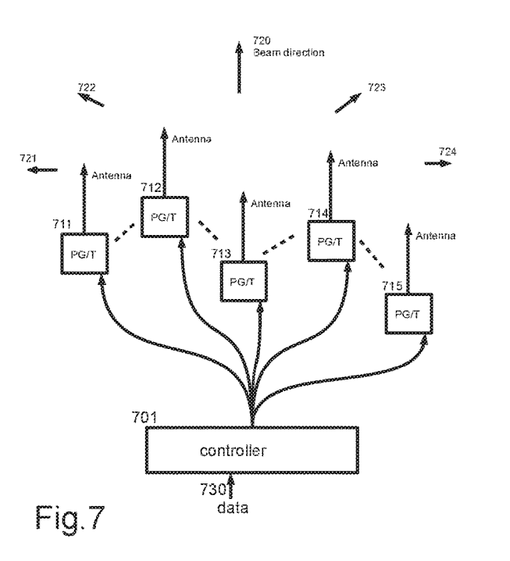
FIG. 7 is a block diagram of an pulse coupling DAC using antennas, according to an embodiment.

FIG. 7 depicts a pulse coupling DAC in which the pulses are propagated in antenna elements 711 to 715. The antenna elements 711 to 715 can consist of radiation elements, a pulse generator and/or a termination element. Controller 701 receives a digital input data stream 730 and decodes the data stream similar to the decoding of the a DAC. The decoded data is then sent to the antenna elements 711 to 715. The antenna elements can generate electromagnetic pulses and radiate the electromagnetic pulse via the radiation elements of the antenna elements. The electromagnetic pulse will combine in the free space between the antenna elements to form the output signal or output beam.

For simplicity reasons most embodiments are shown with three or four coupled transmission lines. However, any number of coupled transmission lines can be implemented. Segmentation techniques, as used in current steering DACs, can be used to optimize the design for power, area and performance. For example in a 12 bit digital to analog converter. The 6 most significant bit can be thermometer decoded resulting in 63 transmission lines. The 6 least significant bit can be binary decoded adding an additional 6 transmission lines. The coupling of the least significant transmission lines will be weighed according to the weight of the associated bit.

Multiple sets of pulse coupling DACs of FIG. 7 can be combined to form an antenna array. Adjusting the delay, or the phase, of the multiple antenna elements the beam 720, i.e. the main direction of the radiated energy, can be controlled. Similarly the radiation pattern of the quantization noise 721 to 724 can be influenced. The phasing, or the timing, of the antenna elements can be optimized to maximize the energy in the beam in the desired direction and minimize the energy of the quantization noise in a certain direction.

In the context of the description transmission lines are used to explain the operation of the circuits. However, any form of wave propagation medium can be used for the implementation of the circuits.

The transmission lines can be implemented on a chip with the termination elements and controller. The area occupied by an on-chip transmission lines operating at frequencies below 10 GHz is significant and in most cases impractical. However, at higher frequencies or by using slow wave transmission lines on-chip implementations are feasible. Tuning the sampling frequency of the digital to analog converter can be achieved by applying tunable transmission lines, such as Distributed MEMS transmission lines, lumped distributed transmission line, and/or digitally controlled artificial dielectric (DiCad) transmission lines. The transmission lines can be implemented as coaxial cable, wave guide, strip line, micro strip line or coplanar wave guide.

Multi-chip modules can also be used to implement the described systems. For example, the controller and the can be implemented in a first process technology on a first chip, and the switches can be implemented in a second process technology on a second chip. Both chips can be integrated on a common laminate in a multi-chip module. The transmission lines can be implemented on the laminate. The achievable output power is limited by the breakdown voltages of the switching elements. Using GaN technology with breakdown voltages up to 80V for the switching elements, for example, output power levels up to 100 Watt can be achieved in embodiments.

The terms electromagnetic waves and electromagnetic pulses or 'pulses' are used interchangeably in this context.

The termination elements can be designed using resistive devices. In this case the energy on the termination elements will be converted into thermal energy and will be lost. Another way is to terminate to an active circuit as described in PCT/US2015/042049 in which the energy delivered to the termination element is reused. All presented embodiments can be embedded in a digital pre-distortion loop as depicted in FIG. 1c to establish the desired relation ship between the digital input signals and the output signals of the pulse digital to analog converter.

The termination elements can be designed using resistive devices. In this case the energy on the termination elements will be converted into thermal energy and will be lost. Another way is to terminate to an active circuit as described in PCT/US2015/042049 in which the energy delivered to the termination element is reused. Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A digital to analog converter circuit comprising:
    a controller configured to receive a digital input data stream;
    a plurality of wave propagation media wherein some or all wave propagation media are electromagnetically coupled to each other;
    one or more electric power source wherein the power from the one or more electric power sources is used to generate electromagnetic pulses; and
    an output terminal wherein the output terminal is coupled to at least one of the wave propagation media;
    wherein the controller controls the generation and flow of electromagnetic pulses in the plurality of wave propagation media to form a signal at the output terminal which corresponds to the digital input signal.

2. The digital to analog converter according to claim 1, wherein the one or more electric power sources are pulse generators and the pulse generators and are controlled by the controller.

3. The digital to analog converter according to claim 1 further comprising a plurality of termination elements, each of the plurality of termination elements coupled to one of the wave propagation media, and the termination elements are controlled by the controller to set an impedance state thereof.

4. The digital to analog converter according to claim 1 further comprising a plurality of termination elements arranged such that a termination element is coupled to both ends of a subset of the plurality of wave propagation media, and the termination elements are controlled by the controller.

5. The digital to analog converter according to claim 1, wherein:
    a first subset of the plurality of wave propagation media is coupled to the output terminal;
    a second subset of the plurality of wave propagation media is coupled to a pulse generator; and
    a third subset of the plurality of wave propagation media is terminated by termination element controlled by the controller,
    wherein the third subset of the plurality of wave propagation media controls the effective coupling between the first and the second set of the plurality of wave propagation media.

6. The digital to analog converter according to claim 1, wherein a subset of the plurality of wave propagation media are coupled to the inputs of a combining network, and the output of the combining network is coupled to the output terminal.

7. The digital to analog converter according to claim 1, further comprising
    a second output terminal, wherein the second output terminal is connected to a subset of the plurality of wave propagation media,
    wherein a signal at the second output terminal is a complementary signal to the signal at the output terminal.

8. The digital to analog converter according to claim 1, wherein the plurality of wave propagation media is partitioned in a plurality of subsets of wave propagation media, and each subset of wave propagation media is operated with electromagnetic pulses which have a different time base.

9. The digital to analog converter according to claim 1, wherein the wave propagation media are transmission lines.

10. The digital to analog converter according to claim 1, wherein some of the wave propagation media are antennas and the coupling between the antennas occurs in free space.

11. The digital to analog converter according to claim 1, wherein the digital to analog converter is embedded in a digital pre-distortion loop.

12. The digital to analog converter according to claim 1, wherein the energy delivered to at least some of the termination elements is recovered as electric energy and reused.

13. A method for converting a digital signal to an analog signal, the method comprising:
    generating a first set electromagnetic waves in a first set of one or more electromagnetic wave propagation media;
    coupling the first set electromagnetic waves onto to a second set of one or more electromagnetic wave propagation media to generate a second set of electromagnetic waves;
    combining the second set of electromagnetic waves to form an output signal;
    wherein the generation of the first set of electromagnetic waves and or the coupling from the first set of one or more electromagnetic wave propagation media onto the second set of one or more electromagnetic wave propagation media is controlled by a controller in response to a digital input data stream.

14. The method according to claim 13, wherein the coupling between the first set of electromagnetic wave propagation media and the second set of electromagnetic wave propagation media is controlled by adjusting the impedance of the termination elements connected to the electromagnetic wave propagation media in the first and or the second set of electromagnetic wave propagation media.

15. The method according to claim 13 further comprising:
    sensing part of the output signal;
    converting part of the output signal into digital signal;

comparing the digital signal to the digital input data stream; and digitally pre distorting the digital input data stream to minimize the difference between the output signal the expected output signal.

16. The method according to claim 14 further comprising recovering and reusing the energy which is not reflected back into the electromagnetic wave propagation media by the termination elements.

* * * * *